(12) United States Patent
Lee et al.

(10) Patent No.: US 11,497,121 B2
(45) Date of Patent: Nov. 8, 2022

(54) ELECTRONIC DEVICE COMPRISING CERAMIC LAYER AND CERAMIC HOUSING

(71) Applicant: Samsung Electronics Co., Ltd., Suwon-si (KR)

(72) Inventors: Hoyoung Lee, Suwon-si (KR); Chongo Yoon, Suwon-si (KR); Sunghyup Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/260,320

(22) PCT Filed: Aug. 6, 2019

(86) PCT No.: PCT/KR2019/009777
§ 371 (c)(1),
(2) Date: Jan. 14, 2021

(87) PCT Pub. No.: WO2020/032529
PCT Pub. Date: Feb. 13, 2020

(65) Prior Publication Data
US 2021/0298174 A1  Sep. 23, 2021

(30) Foreign Application Priority Data
Aug. 6, 2018  (KR) .................. 10-2018-0091293

(51) Int. Cl.
*H05K 1/18* (2006.01)
*H05K 5/00* (2006.01)
(Continued)

(52) U.S. Cl.
CPC .......... *H05K 1/181* (2013.01); *H05K 5/0017* (2013.01); *H05K 5/03* (2013.01); *H04M 1/0266* (2013.01);
(Continued)

(58) Field of Classification Search
CPC ...................................................... H05K 1/181
(Continued)

(56) References Cited

U.S. PATENT DOCUMENTS 4,751,146 A * 6/1988 Maeda ................ H05K 1/0326
428/209
6,266,020 B1 * 7/2001 Chang .................... H01Q 1/243
343/702
(Continued)

FOREIGN PATENT DOCUMENTS

CN  203645934 U   6/2014
CN  104425889 A   3/2015
(Continued)

OTHER PUBLICATIONS

Starkov et al., The Thickness Dependence of Dielectric Permittivity in Thin Films, Journal of Physics, 2016 (Year: 2016).*
(Continued)

*Primary Examiner* — Stanley Tso
(74) *Attorney, Agent, or Firm* — Jefferson IP Law, LLP

(57) ABSTRACT

An electronic device is disclosed. The electronic device may comprise: a housing having a first dielectric constant and including a first part; a substrate disposed inside the housing and including a communication module disposed on the surface thereof opposite to the first part; and a ceramic layer formed between the substrate and the first part to cover the communication module, wherein the first part and the ceramic layer are formed to have a second dielectric constant different from the first dielectric constant. Various other embodiments understood through the specification are possible.

14 Claims, 11 Drawing Sheets

(51) Int. Cl.
*H05K 5/03* (2006.01)
*H04M 1/02* (2006.01)

(52) U.S. Cl.
CPC ........... *H05K 2201/0137* (2013.01); *H05K 2201/10098* (2013.01); *H05K 2201/10128* (2013.01)

(58) Field of Classification Search
USPC ............................................. 361/752
See application file for complete search history.

(56) References Cited

U.S. PATENT DOCUMENTS

| | | | |
|---|---|---|---|
| 7,740,946 | B2 | 6/2010 | Morimoto et al. |
| 9,011,997 | B2 | 4/2015 | Weber |
| 9,232,659 | B2 | 1/2016 | Chiang et al. |
| 9,237,661 | B2 | 1/2016 | Weber |
| 9,785,186 | B2 | 10/2017 | Gregg et al. |
| 9,868,274 | B2 | 1/2018 | Kim et al. |
| 9,929,462 | B2 | 3/2018 | Long |
| 9,985,338 | B2 | 5/2018 | Choon et al. |
| 10,461,414 | B2 | 10/2019 | Deng |
| 2007/0298265 | A1 | 12/2007 | Morimoto et al. |
| 2009/0231506 | A1* | 9/2009 | Takata ............... H05K 1/0203 349/58 |
| 2012/0180707 | A1* | 7/2012 | DelloRusso, Jr. ...... E05G 1/024 109/64 |
| 2013/0078398 | A1 | 3/2013 | Weber |
| 2014/0085163 | A1 | 3/2014 | Gregg |
| 2015/0003028 | A1 | 1/2015 | Chiang et al. |
| 2015/0109170 | A1* | 4/2015 | Kang ..................... G06F 1/203 343/702 |
| 2016/0113135 | A1 | 4/2016 | Kim et al. |
| 2016/0374219 | A1 | 12/2016 | Park |
| 2017/0155417 | A1 | 6/2017 | Jeong et al. |
| 2018/0031742 | A1* | 2/2018 | Lai ........................ G02B 5/003 |
| 2018/0083343 | A1 | 3/2018 | Choon et al. |

FOREIGN PATENT DOCUMENTS

| | | |
|---|---|---|
| CN | 206272992 U | 6/2017 |
| CN | 106972254 A | 7/2017 |
| JP | 2010-002890 A | 1/2010 |
| JP | 2015-012298 A | 1/2015 |
| KR | 10-2007-0111488 A | 11/2007 |
| KR | 10-2016-0005642 A | 1/2016 |
| KR | 10-2016-0046119 A | 4/2016 |
| KR | 10-2016-0148299 A | 12/2016 |
| WO | 12171041 A1 | 12/2012 |
| WO | 16069014 A1 | 5/2016 |
| WO | 16081515 A1 | 5/2016 |

OTHER PUBLICATIONS

European Search Report dated Jul. 9, 2021; European Appln. 19848292.9-1216 / 3799402 PCT/KR2019009777.
Korean Office Action with English translation dated Jun. 11, 2022; Korean Appln. No. 10-2018-0091293.
Chinese Office Action with English translation dated Sep. 5, 2022; Chinese Appln. No. 201980052233.7.

* cited by examiner

| EXPERIMENTAL EXAMPLE | | OVERALL PERMITTIVITY(ε) | TRANSMISSION PERFORMANCE | | RECEPTION PERFORMANCE | |
|---|---|---|---|---|---|---|
| | | | 2.4Ghz TRP(dB) | 5Ghz TRP(dB) | 2.4Ghz TRP(dB) | 5Ghz TRP(dB) |
| 610 | White | 17.90 | 10.52 | 9.76 | 72.32 | 75.77 |
| 620 | Black | 26.16 | 10.54 | 6.62 | 69.37 | 72.15 |
| | DIFFERENCE | 8.26 | | | | |
| 630 | BLACK + CERAMIC FILM | 11.15 | 11.23 | 8.76 | 71.86 | 78.76 |
| | DIFFERENCE | 6.75(-1.51) | | | | |

ELECTRONIC DEVICE COMPRISING CERAMIC LAYER AND CERAMIC HOUSING

TECHNICAL FIELD

The disclosure relates to an electronic device including a ceramic layer and a ceramic housing.

BACKGROUND ART

Ceramic materials having different colors differ from one another in terms of components contained therein and electrical performance (e.g., permittivity). For this reason, only a small number of colors capable of satisfying electrical performances may be applied to mobile wireless communication devices to which conventional ceramic cover parts are applied. Furthermore, only sheets for diffusing heat generated from internal parts may be attached to the insides of the ceramic cover parts.

Ceramic materials may contain pigments mainly containing metal components so as to express colors. Ceramic parts with different colors contain pigments having different components. Due to this, cover parts containing ceramic materials have different electrical performances depending on colors. Furthermore, the composition of components is different for each company that manufactures a ceramic material, and therefore so as to use ceramic materials having various colors as cover parts of wireless communication devices, internal parts (electrical parts, antennas, and the like) that are separately tuned depending on wireless communication characteristics of the materials used for the cover parts may be included. Including the internal parts having different specifications depending on the cover colors may cause a rise in the difficulty level of a process and difficulty in part inventory management. For this reason, the wireless communication devices to which the ceramic cover parts are applied cannot support various colors.

DISCLOSURE

Technical Problem

Embodiments disclosed in the disclosure are aimed at providing an electronic device having uniform performance by reducing a wireless communication performance difference that is like to occur when electronic devices include ceramic housings formed of different materials and the same wireless communication module.

Technical Solution

An electronic device according to various embodiments includes a housing including a first portion having a first permittivity, a circuit board that is disposed in the housing and that has a communication module disposed on a surface of the circuit board that faces the first portion, and a ceramic layer formed between the circuit board and the first portion to cover the communication module, and the first portion and the ceramic layer together form a second permittivity different from the first permittivity.

An electronic device according to various embodiments includes a first cover having a display area formed therein, a second cover that faces the first cover and that is formed of a composition containing a first ceramic material, a side frame that surrounds a space between the first cover and the second cover, and a circuit board that is disposed in the space formed by the first cover, the second cover, and the side frame and that includes a communication module that transmits and receives radio waves. A radiation area through which the radio waves pass is formed in at least part of the second cover, and the electronic device further includes a ceramic film that is disposed between the radiation area and the communication module to pass the radio waves and that contains a second ceramic material.

An electronic device according to various embodiments includes a cover that forms a first surface of the electronic device and that has a display area formed in at least part thereof, a housing including a first portion that faces the cover and a second portion that surrounds an interior space between the first portion and the cover, the housing being formed of a composition containing a ceramic material, a communication module that is disposed in the interior space of the housing and that includes a radiating surface that faces at least part of the second portion of the housing, and a ceramic layer disposed between the at least part of the second portion of the housing and the radiating surface.

Advantageous Effects

According to embodiments of the disclosure, an electronic device including a housing containing a ceramic material and a compound may have uniform wireless communication performance irrespective of the type of the compound.

Accordingly, the same wireless communication module may be disposed in an electronic device having a different color, and thus productivity may be improved.

In addition, the disclosure may provide various effects that are directly or indirectly recognized.

DESCRIPTION OF DRAWINGS

FIG. 5 is a view from the rear of the electronic device illustrated in FIG. 4.

With regard to description of the drawings, identical or similar reference numerals may be used to refer to identical or similar components.

MODE FOR INVENTION

Hereinafter, various embodiments of the disclosure will be described with reference to the accompanying drawings. However, those of ordinary skill in the art will recognize that modifications, equivalents, and/or alternatives on the various embodiments described herein can be variously made without departing from the scope and spirit of the disclosure.

Figure 1:
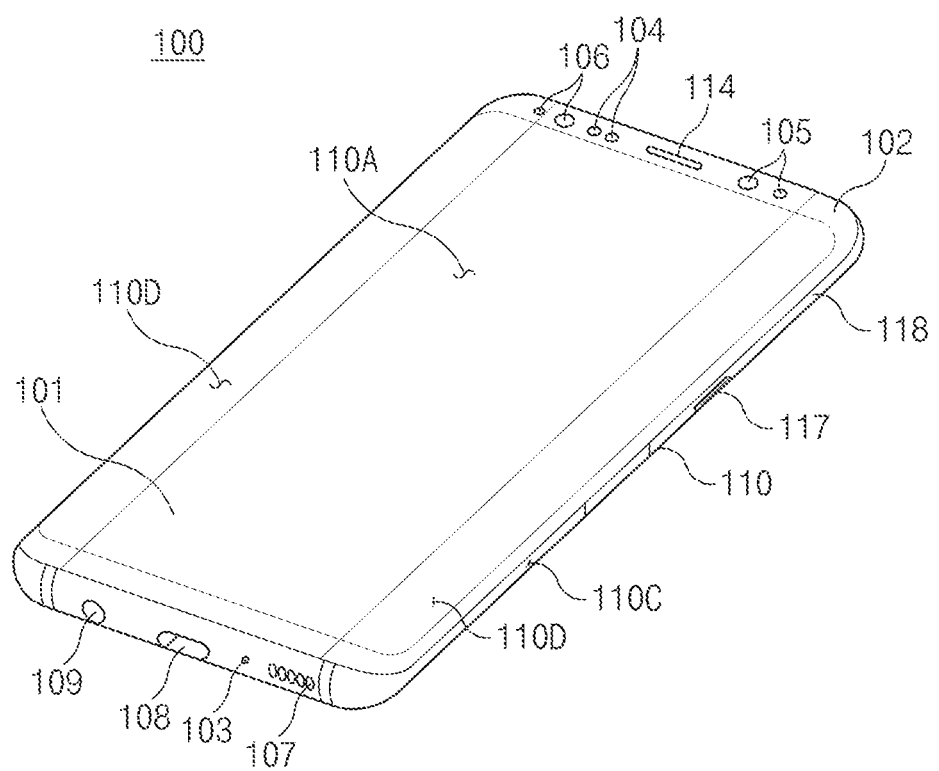
FIG. 1 is a front perspective view of an electronic device according to an embodiment.
Figure 2:
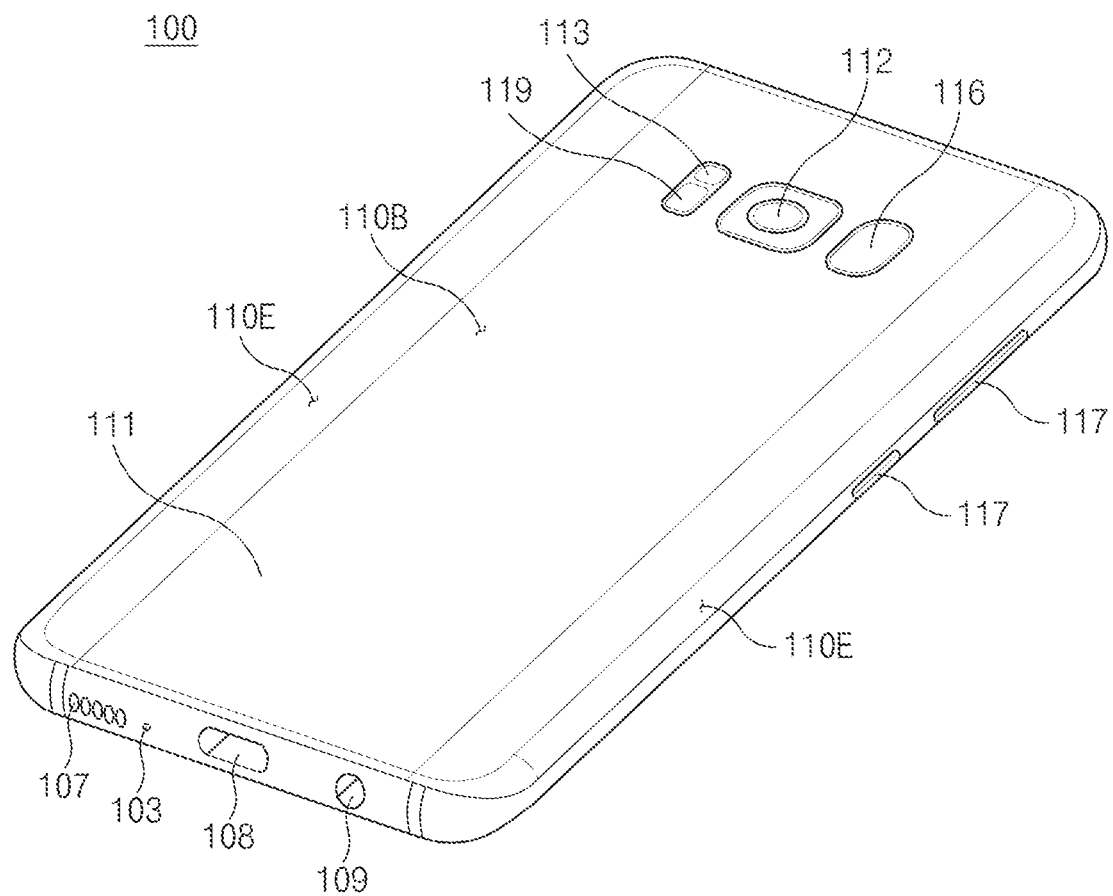
FIG. 2 is a rear perspective view of the electronic device of FIG. 1.

Referring to FIGS. 1 and 2, an electronic device 100 according to an embodiment may include a housing 110 that includes a first surface (or, a front surface) 110A, a second surface (or, a rear surface) 110B, and side surfaces 110C surrounding a space between the first surface 110A and the second surface 110B. In another embodiment (not illustrated), a housing may refer to a structure that forms some of the first surface 110A, the second surface 110B, and the side surfaces 110C of FIG. 1. According to an embodiment, the first surface 110A may be formed by a front plate 102, at least part of which is substantially transparent (e.g., a glass plate including various coating layers, or a polymer plate). The second surface 110B may be formed by a back plate 111 that is substantially opaque. The back plate 111 may be formed of, for example, coated or colored glass, ceramic, polymer, metal (e.g., aluminum, stainless steel (STS), or magnesium), or a combination of at least two of the aforementioned materials. The side surfaces 110C may be formed by a side bezel structure (or, a "side member") 118 that is coupled with the front plate 102 and the back plate 111 and that contains metal and/or polymer. In some embodiments, the back plate 111 and the side bezel structure 118 may be integrally formed with each other and may contain the same material (e.g., a metallic material such as aluminum).

In the illustrated embodiment, the front plate 102 may include, at opposite long edges thereof, two first areas 110D that curvedly and seamlessly extend from the first surface 110A toward the back plate 111. In the illustrated embodiment (refer to FIG. 2), the back plate 111 may include, at opposite long edges thereof, two second areas 110E that curvedly and seamlessly extend from the second surface 110B toward the front plate 102. In some embodiments, the front plate 102 (or, the back plate 111) may include only one of the first areas 110D (or, the second areas 110E). In another embodiment, a part of the first areas 110D or the second areas 110E may not be included. In the embodiments, when viewed from a side of the electronic device 100, the side bezel structure 118 may have a first thickness (or, width) at sides not including the first areas 110D or the second areas 110E and may have a second thickness smaller than the first thickness at sides including the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, a light emitting element 106, and connector holes 108 and 109. In some embodiments, the electronic device 100 may omit at least one component (e.g., the key input devices 117 or the light emitting element 106) among the aforementioned components, or may additionally include other component(s).

The display 101, for example, may be exposed through most of the front plate 102. In some embodiments, at least part of the display 101 may be exposed through the front plate 102 that forms the first surface 110A and the first areas 110D of the side surfaces 110C. In some embodiments, the periphery of the display 101 may be formed to be substantially the same as the shape of the adjacent periphery of the front plate 102. In another embodiment (not illustrated), the gap between the periphery of the display 101 and the periphery of the front plate 102 may be substantially constant to expand the area by which the display 101 is exposed.

In another embodiment (not illustrated), recesses or openings may be formed in part of a screen display area of the display 101, and the electronic device 100 may include at least one of the audio module 114, the sensor module 104, the camera module 105, and the light emitting element 106 that are aligned with the recesses or the openings. In another embodiment (not illustrated), the electronic device 100 may include, on a rear surface of the screen display area of the display 101, at least one of the audio module 114, the sensor module 104, the camera module 105, the fingerprint sensor 116, and the light emitting element 106. In another embodiment (not illustrated), the display 101 may be combined with, or disposed adjacent to, touch detection circuitry, a pressure sensor for measuring the intensity (pressure) of a touch, and/or a digitizer for detecting a stylus pen of a magnetic field type. In some embodiments, at least a part of the sensor modules 104 and 119 and/or at least a part of the key input devices 117 may be disposed in the first areas 110D and/or the second areas 110E.

The audio modules 103, 107, and 114 may include the microphone hole 103 and the speaker holes 107 and 114. A microphone for obtaining a sound from the outside may be disposed in the microphone hole 103. In some embodiments, a plurality of microphones may be disposed in the microphone hole 103 to detect the direction of a sound. The speaker holes 107 and 114 may include the external speaker hole 107 and the receiver hole 114 for a telephone call. In some embodiments, the speaker holes 107 and 114 and the microphone hole 103 may be implemented with a single hole, or a speaker (e.g., a piezo speaker) may be included without the speaker holes 107 and 114.

The sensor modules 104, 116, and 119 may generate an electrical signal or a data value that corresponds to an operational state inside the electronic device 100 or an environmental state external to the electronic device 100. The sensor modules 104, 116, and 119 may include, for example, the first sensor module 104 (e.g., a proximity sensor) and/or the second sensor module (not illustrated) (e.g., a fingerprint sensor) that is disposed on the first surface 110A of the housing 110, and/or the third sensor module 119 (e.g., an HRM sensor) and/or the fourth sensor module 116 (e.g., a fingerprint sensor) that is disposed on the second surface 110B of the housing 110. The fingerprint sensor may be disposed not only on the first surface 110A of the housing 110 (e.g., the display 101) but also on the second surface 110B. The electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or the illuminance sensor 104.

The camera modules 105, 112, and 113 may include the first camera device 105 disposed on the first surface 110A of the electronic device 100, and the second camera device 112 and/or the flash 113 disposed on the second surface 110B. The camera devices 105 and 112 may include one or more lenses, an image sensor, and/or an image signal processor. The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. In another embodiment, the electronic device 100 may not include all or some of the aforementioned key input devices 117, and the key input devices 117 not included may be implemented in a different form such as a soft key on the display 101. In some embodiments, the key input devices 117 may include the sensor module 116 disposed on the second surface 110B of the housing 110.

The light emitting element 106, for example, may be disposed on the first surface 110A of the housing 110. The light emitting element 106, for example, may provide state information of the electronic device 100 in the form of light. In another embodiment, the light emitting element 106 may provide, for example, a light source that operates in conjunction with operation of the camera module 105. The light emitting element 106 may include, for example, an LED, an IR LED, and a xenon lamp.

The connector holes 108 and 109 may include the first connector hole 108 for accommodating a connector (e.g., a USB connector) for transmitting and receiving electric power and/or data with an external electronic device, and/or the second connector hole 109 (e.g., an earphone jack) for accommodating a connector for transmitting and receiving audio signals with an external electronic device.

Figure 3:
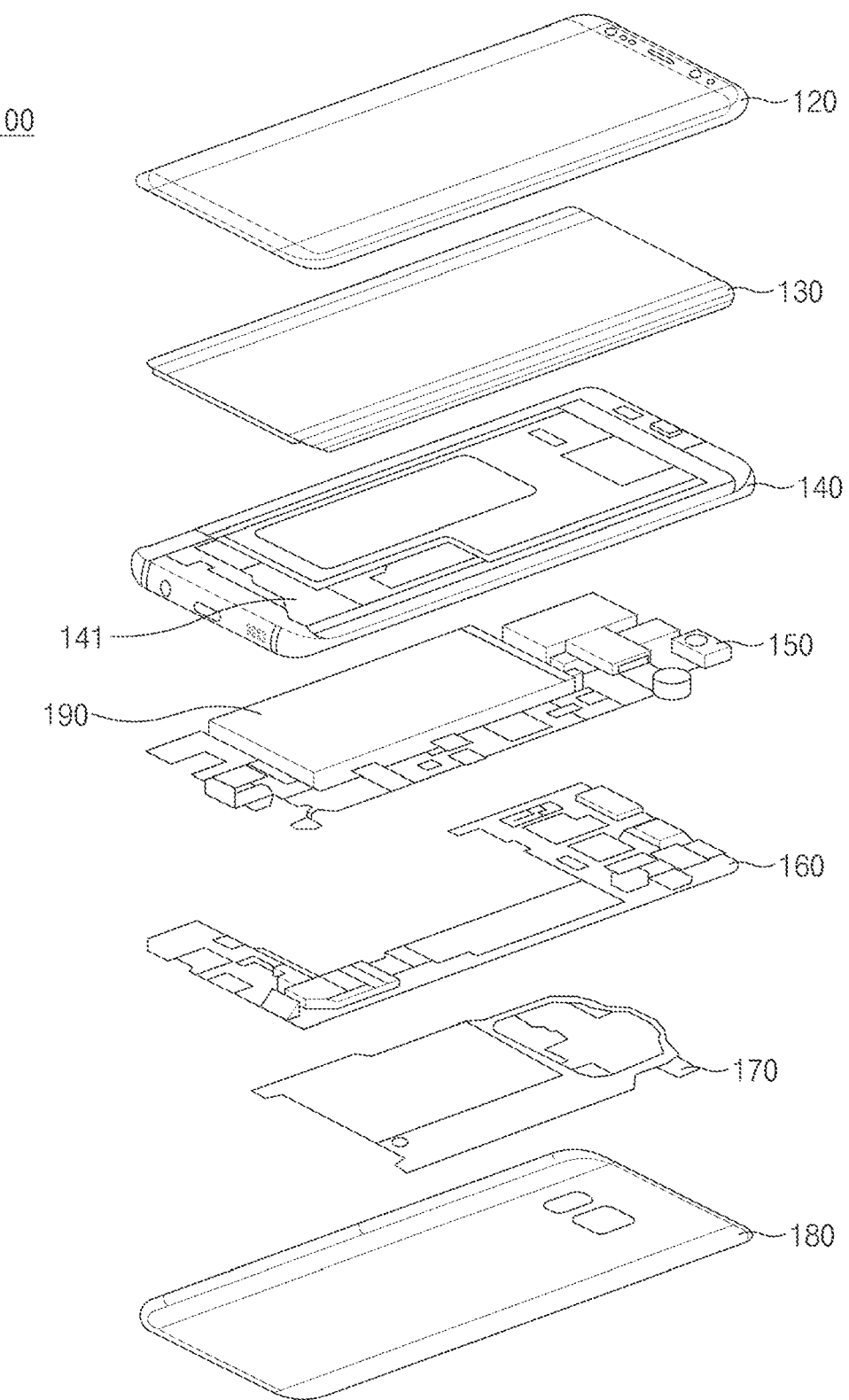
FIG. 3 is an exploded perspective view of the electronic device of FIG. 1.

Referring to FIG. 3, the electronic device 100 may include a side bezel structure 140 (e.g., a side member), a first support member 141 (e.g., a bracket), a front plate 120, a display 130, a printed circuit board 150, a battery 190, a second support member 160 (e.g., a rear case), an antenna 170, and a back plate 180. In some embodiments, the electronic device 100 may omit at least one component (e.g., the first support member 141 or the second support member 160) among the aforementioned components, or may additionally include other component(s). At least one of the components of the electronic device 100 may be the same as, or similar to, at least one of the components of the electronic device 100 of FIG. 1 or 2, and repetitive descriptions will hereinafter be omitted.

The first support member 141 may be disposed inside the electronic device 100 and may be connected with the side bezel structure 140, or may be integrally formed with the side bezel structure 140. The first support member 141 may be formed of, for example, a metallic material and/or a nonmetallic (e.g., polymer) material. The display 130 may be coupled to one surface of the first support member 141, and the printed circuit board 150 may be coupled to an opposite surface of the first support member 141. The printed circuit board 150 may have a processor, a memory, and/or an interface mounted thereon. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. For example, the interface may electrically or physically connect the electronic device 100 with an external electronic device and may include a USB connector, an SD card/MMC connector, or an audio connector.

The battery 190, which is a device for supplying electric power to at least one component of the electronic device 100, may include, for example, a primary cell that is not rechargeable, a secondary cell that is rechargeable, or a fuel cell. At least part of the battery 190, for example, may be disposed on substantially the same plane as the printed circuit board 150. The battery 190 may be integrally disposed inside the electronic device 100, or may be disposed so as to be detachable from the electronic device 100.

The antenna 170 may be disposed between the back plate 180 and the battery 190. The antenna 170 may include, for example, a near field communication (NFC) antenna, a wireless charging antenna, and/or a magnetic secure transmission (MST) antenna. For example, the antenna 170 may perform short-range communication with an external device, or may wirelessly transmit and receive electric power required for charging. In another embodiment, an antenna structure may be formed by part of the side bezel structure 140 and/or part of the first support member 141, or a combination thereof.

Figure 4:
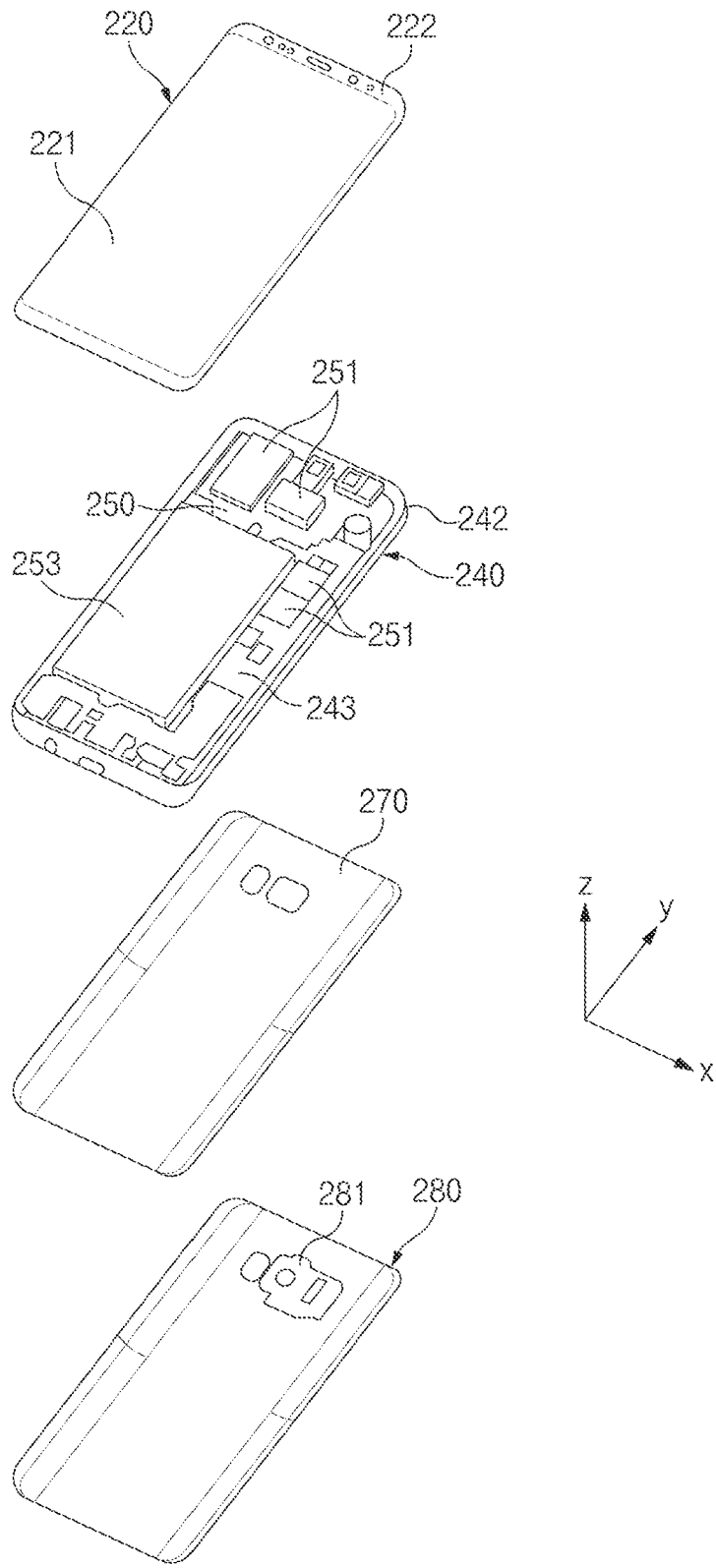
FIG. 4 is an exploded perspective view of an electronic device according to an embodiment.

FIG. 4 is an exploded perspective view of an electronic device according to an embodiment.

According to an embodiment, the electronic device 200 may include a first cover 220 (e.g., the front plate 120 of FIG. 3), a side member 240 (e.g., the side bezel structure 140 of FIG. 3) that is connected with the first cover 220 to form an interior space, a circuit board 250 (e.g., the printed circuit board 150 of FIG. 3) that is disposed in the interior space, a ceramic layer 270 disposed under the circuit board 250, and a second cover 280 (e.g., the back plate 180 of FIG. 3) that is disposed under the ceramic layer 270.

In the following description, based on FIG. 4, a surface formed by the first cover 220 is referred to as a front surface of the electronic device 200, and a surface formed by the second cover 280 is referred to as a rear surface of the electronic device 200. In this case, the front surface and/or the rear surface may be formed to be a curved surface.

In an embodiment, at least part of the first cover 220 (e.g., a front cover) may be formed of a transparent glass material. The first cover 220 may include a display area 221 formed to be transparent such that a display is visually exposed and an opaque area 222 (e.g., a bezel area) that surrounds at least part of the periphery of the display area 221 and that is formed to be opaque. The display (not illustrated) (e.g., the display 130 of FIG. 3) may be disposed under the display area 221.

Referring to FIG. 4, the side member 240 and the circuit board 250 may be disposed under the first cover 220. The side member 240 may include a first structure 242 extending from the periphery of the first cover 220 to surround side surfaces of the electronic device 200 and a second structure 243 (e.g., the first support member 141 of FIG. 3) that extends toward the inside of the electronic device 200. The first structure 242 of the side member 240 may form most of the side surfaces of the electronic device 200. The side member 240 may be connected with the first cover 220 in one direction (e.g., the +Z-axis direction) and may be connected with the second cover 280 in an opposite direction (e.g., the −Z-axis direction), and an interior space may be formed by the first cover 220, the second cover 280, and the side member 240. The circuit board 250 and a battery 253 may be disposed in the interior space.

Referring to FIG. 4, the battery 253 and the circuit board 250 having one or more electrical elements 251 mounted thereon for implementing various functions of the electronic device 200 may be disposed inside the side member 240. The circuit board 250 may be disposed on a surface of the first structure 242 of the side member 240 that faces toward the rear surface of the electronic device 200. The circuit board 250 may be disposed under the display. In the illustrated embodiment, the circuit board 250 may be formed in the shape of "c". Without being necessarily limited thereto, however, the shape of the circuit board 250 may vary depending on the shape of the battery 253.

In an embodiment, the circuit board 250 may include a first surface facing toward the front surface of the electronic device 200 and a second surface facing toward the rear surface of the electronic device 200. Some of the electrical elements 251 may be mounted on the first surface of the circuit board 250, and the others may be mounted on the second surface of the circuit board 250.

Referring to FIG. 4, the ceramic layer 270 and the second cover 280 may be disposed under the circuit board 250. The second cover 280 may be connected to the periphery of the second structure 243 of the side member 240 and may form the space in which the circuit board 250 and a rear case (not illustrated) are disposed. The second cover 280 may form most of the rear surface of the electronic device 200. At least part of the second cover 280 may be formed of an opaque glass material. A camera area 281 through which a camera is visually exposed may be formed in the second cover 280. The camera area 281 may be formed of a transparent glass material.

Referring to FIG. 4, the ceramic layer 270 may be disposed between the second cover 280 and the circuit board 250. In the illustrated embodiment, the ceramic layer 270 may be formed in a shape corresponding to the second cover 280. Without being necessarily limited thereto, however, the ceramic layer 270 may be formed in various shapes. Referring to FIG. 4, the ceramic layer 270 is illustrated as being formed of a ceramic sheet or a ceramic film Without being necessarily limited thereto, however, the ceramic layer 270 may be formed by coating an inner surface of the second cover 280 (e.g., a surface of the second cover 280 that faces in the +Z-axis direction) with a ceramic material.

In some embodiments, the electronic device 200 may include a housing (e.g., the first cover 220, the second cover 280, and the side member 240), and the housing may include a first surface (e.g., the first cover 220) on which the display area 221 is formed, a second surface (e.g., the second cover 280) that faces the first surface, and third surfaces (e.g., the side member 240) that surround a space between the first surface and the second surface. In this case, the second surface (e.g., the second cover 280) and/or the third surfaces (e.g., the side member 240) may be formed of a composition containing a ceramic material. The circuit board 250 may be disposed between the first surface and the second surface.

Figure 5:
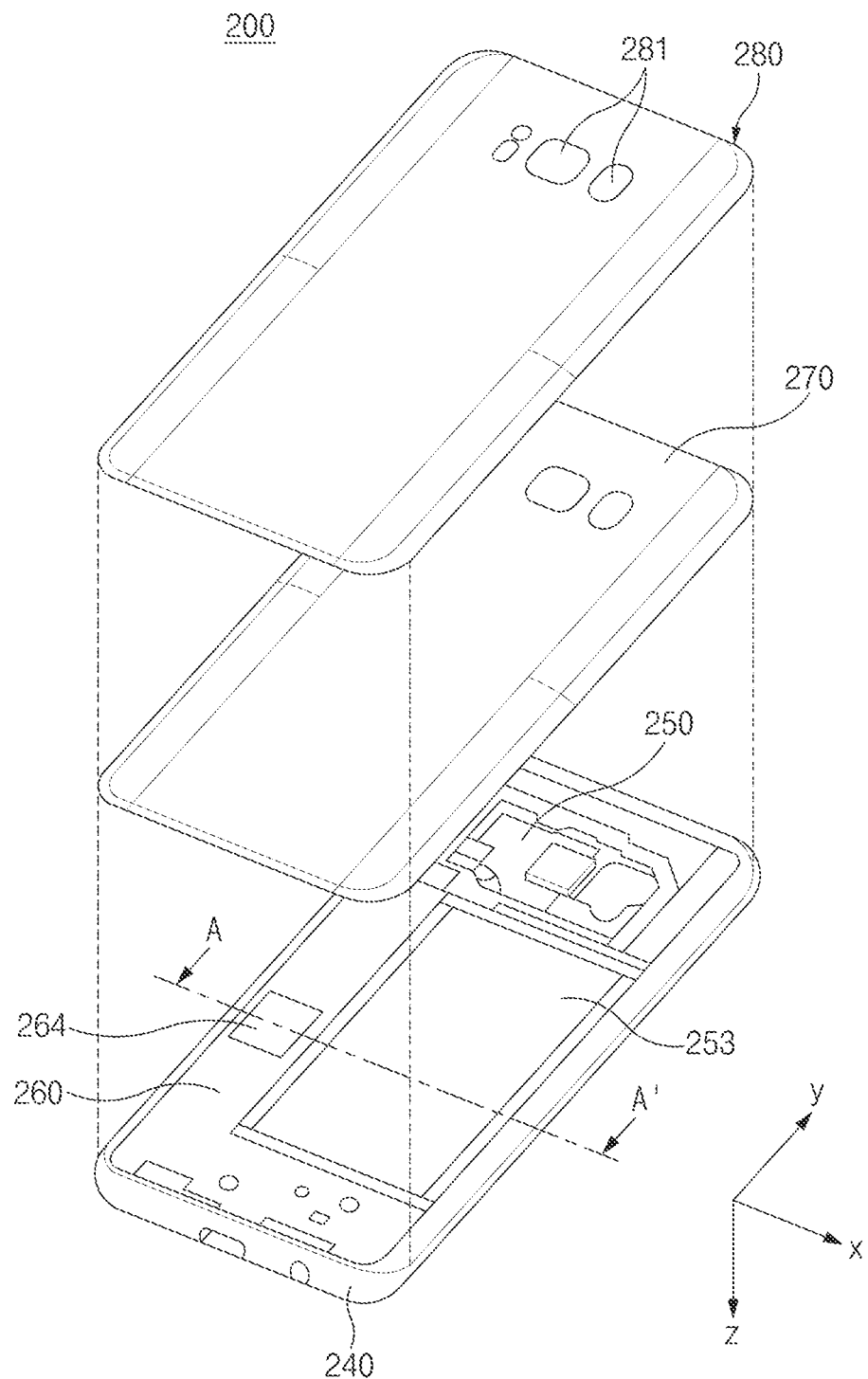
FIG. 5 is an exploded perspective view of the electronic device according to an embodiment, where

FIG. 5 is an exploded perspective view of the electronic device according to an embodiment. FIG. 5 is a view from the rear of the electronic device illustrated in FIG. 4.

Referring to FIG. 5, the electronic device 200 may include the side member 240 (e.g., the side bezel structure 140 of FIG. 3) and the second cover 280 (e.g., the back plate 180 of FIG. 3), and a rear case 260 (e.g., the second support member 160 of FIG. 3), the battery 253 (e.g., the battery 190 of FIG. 3), and the ceramic layer 270 may be disposed in the space formed by the side member 240 and the second cover 280.

The side member 240 may form most of the side surfaces of the electronic device 200 and may be connected with the second cover 280 of the electronic device 200. The side member 240 may be formed to surround at least part of the periphery of the circuit board 250. The second cover 280 may form most of the rear surface of the electronic device 200.

In an embodiment, the electronic device 200 may include the rear case 260 disposed between the circuit board 250 and the ceramic layer 270. One or more first communication modules 264 may be disposed on a surface of the rear case 260 that faces toward the rear surface of the electronic device 200.

In an embodiment, the first communication modules 264 may implement a wireless communication function of the electronic device 200 by radiating radio waves of the electronic device 200. For example, the first communication modules 264 may receive radio waves from outside the electronic device 200, or may transmit radio waves to the outside. At this time, the radio waves may pass through at least part of the second cover 280 or the side member 240. For example, the first communication modules 264 may be modules that perform a communication function of at least one of NFC, Bluetooth, WIFI, GPS, LTE, and an mmWave antenna module (e.g., a 5G antenna module). The mmWave antenna module for transmitting and receiving radio waves having mm wavelengths may be an antenna module that generally transmits and receives signals in a high-frequency band of 3 GHz or more.

In an embodiment, the ceramic layer 270 may be disposed between the second cover layer 280 and the rear case 260. The ceramic layer 270 may be formed in a shape corresponding to the second cover 280. The periphery of the ceramic layer 270 may be connected with the first structure 242 of the side member 240, which forms the side surfaces of the electronic device 200, but may not be exposed on the side surfaces of the electronic device 200. The ceramic layer 270 may be formed to cover one surface (e.g., a surface facing toward the rear surface of the electronic device 200) of the rear case 260. For example, the ceramic layer 270 may be formed to cover the one or more first communication modules 264 disposed on at least the rear case 260.

In various embodiments, the ceramic layer 270 is not limited to the shape illustrated in FIG. 5 and may be disposed to cover the first communication modules 264 mounted on at least the circuit board 250 or to pass radio waves radiated (radio waves transmitted and received) from the first communication modules 264.

In various embodiments, the ceramic layer 270 may have various shapes or thicknesses depending on radio-wave characteristics such as directions, intensities, or frequencies (e.g., 2.4 GHz and 5 GHz) of radio waves radiated by the first communication modules 264. Furthermore, as illustrated in FIG. 5, the ceramic layer 270 may be formed in a film or sheet shape. Without being limited thereto, however, the ceramic layer 270 may be formed on an inner surface of the side member 240 or the second cover 280 by coating.

In some embodiments, radio waves transmitted or received from the first communication modules 264 may be radiated along various paths, but may pass through at least the ceramic layer 270 and may pass through at least a part of housing structures (e.g., the side member 240, the second cover 280, and the front cover (e.g., the first cover 220 of FIG. 4)). In other words, a part of the housing structures may be located on a path along which radio waves travel.

In an embodiment, the housing structures (e.g., the side member 240, the second cover 280, and the front cover (e.g., the first cover 220 of FIG. 4)) may be formed of a composition containing a ceramic material. However, the composition may further contain additional compounds. For example, depending on the colors of the exteriors of the housing structures, the composition may further contain various compounds or metal compounds. In this case, characteristics of radio waves passing through the housing structures may be changed by the compounds. For example, the compounds may change the permittivities of the housing structures. In various embodiments, the electronic device 200 may further include the ceramic layer 270 suitable to adjust changed characteristics of radio waves passing through the housing structures to a preferred range.

In various embodiments, a part of the housing structures (e.g., the side member 240, the second cover 280, and the front cover (e.g., the first cover 220 of FIG. 4)) that are located on paths of radio waves radiated from the first communication modules 264 may have a first permittivity, and the ceramic layer 270 may have a second permittivity. In this case, the part of the housing structures and the ceramic layer 270 through which radio waves pass may form a third permittivity. In other words, the ceramic layer 270 and the housing structures may form the third permittivity, and radio waves radiated from the first communication modules 264 may be understood as passing through a dielectric having the third permittivity. The third permittivity may be a suitable permittivity or a suitable permittivity range to implement preferred wireless communication performance of the electronic device 200. Specifically, the housing structures having different colors may further contain different materials and therefore may have different permittivities. In contrast, the first communication modules 264 may have the same wireless communication performance irrespective of the colors of the housing structures. In this case, the wireless communication performance of the electronic device may vary depending on the color of the exterior.

Accordingly, the electronic device 200 according to an embodiment may include the ceramic layer 270 having an appropriate physical property (e.g., permittivity) and thus may have uniform wireless communication performance independently of the color of the electronic device 200.

In an embodiment, the third permittivity, which is formed by the ceramic layer 270 and the housing structures located on radiation paths of radio waves, may be a constant permittivity or a constant permittivity range irrespective of components of the housing structures that vary depending on various colors. That is, even in a case where electronic devices include housing structures having different colors (that is, housing structures having different components), the electronic devices may include the same communication module, and thus there is an advantageous effect of improving productivity.

Figure 6A:
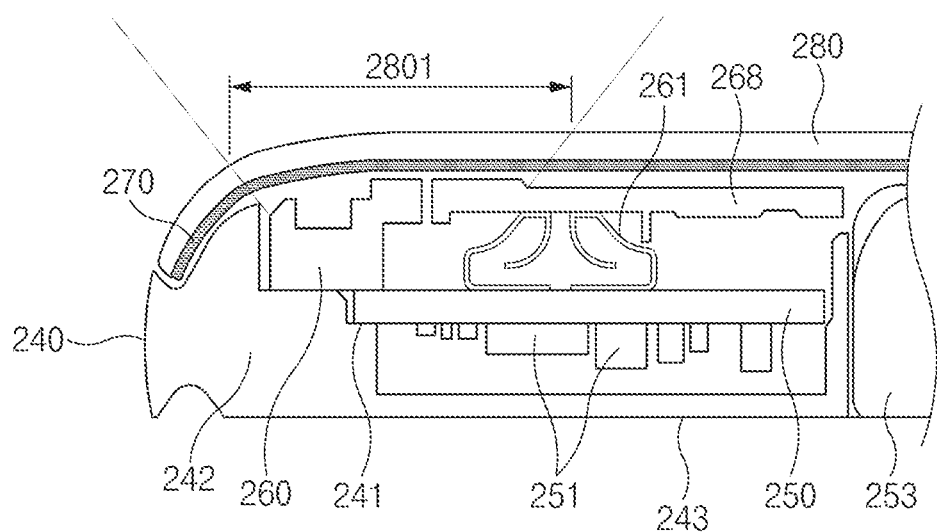
FIG. 6A is a sectional view taken along line A-A' of FIG. 5.
Figure 6B:
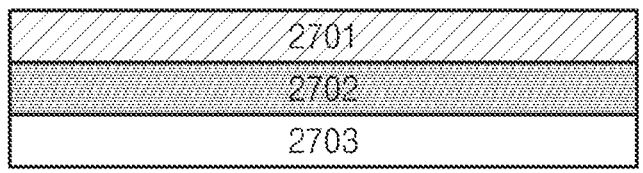
FIG. 6B is a view illustrating sections of a ceramic layer.
Figure 6B:
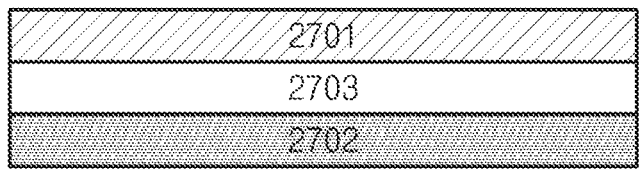
Figure 6B:
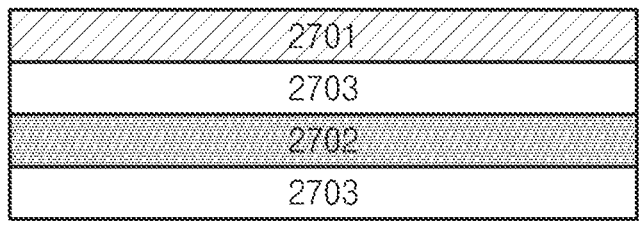

FIG. 6A is a sectional view taken along line A-A' of FIG. 5. FIG. 6B is a view illustrating sections of the ceramic layer.

Referring to FIG. 6A, the electronic device 200 may include the housing including the second cover 280 and the side member 240, the circuit board 250 disposed in the housing, the rear case 260 disposed between the circuit board 250 and the second cover 280, an antenna board 268 (e.g., the first communication modules 264 of FIG. 5) that is formed on the rear case 260, and the ceramic layer 270 disposed between the second cover 280 and the antenna board 268. The antenna board 268 may be implemented with a conductive pattern formed on one surface of the rear case 260. The antenna board 268 may be electrically connected with the circuit board 250 through a connector 261.

Referring to FIG. 6A, the side member 240 may further include the first structure 242 that forms at least a part of the side surfaces of the electronic device 200 and the second structure 243 that extends toward the inside of the electronic device 200. Referring to the sectional view, the second structure 243 of the side member 240 may extend in the X-axis direction.

The side member 240 and at least part of the second cover 280 may be formed of a composition containing a ceramic material, and the composition may further contain additional compounds for forming various colors of the housing.

In an embodiment, the circuit board 250 may be disposed parallel to the second structure 243 of the side member 240. An end portion of the circuit board 250 that faces in the X-axis direction may be disposed on a stopper 241 of the side member 240. The one or more electrical elements 251 may be disposed on the circuit board 250.

In an embodiment, the antenna board 268 may radiate radio waves toward the side surfaces and/or the rear surface of the electronic device 200. The radio waves radiated from the antenna board 268 may pass through at least part of the second cover 280 and/or at least part of the side member 240.

In an embodiment, the ceramic layer 270 may be formed on the second cover 280 and an area 2801 of the side member 240 through which the radio waves radiated from the antenna board 268 pass. The ceramic layer 270 may be formed on the inner surface of the second cover 280 and/or the side member 240, or may be formed in a separate sheet or film form and disposed to cover the antenna board 268. Alternatively, the ceramic layer 270 may be provided by depositing a ceramic material onto at least part of the inner surface of the second cover 280 and/or the side member 240 through a sputtering process. In another case, the ceramic layer 270 may be provided by coating at least part of the inner surface of the second cover 280 and/or the side member 240 with a solution containing a ceramic material.

In some embodiments, the electronic device 200 may include the housing (e.g., the first cover 220, the side member 240, and the second cover 280 of FIG. 4) in which the antenna board 268 is disposed, a radiation area 2801 formed on at least part of the housing, and a ceramic film that corresponds to the radiation area 2801 and that is disposed between an inner surface of the housing and the antenna board 268. The radiation area 2801 may refer to a partial area of the housing through which radio waves radiated from the antenna board 268 pass. The ceramic layer 270 may be formed or disposed on an inner surface of the housing that corresponds to the radiation area 2801.

Referring to FIG. 6B, in an embodiment, the ceramic layer 270 may include a base layer 2702, an adhesive layer 2701 formed on one surface of the base layer 2702, and a ceramic coating layer 2703 formed on an opposite surface of the base layer 2702. Alternatively, the ceramic coating layer 2703 may be formed between the base layer 2702 and the adhesive layer 2701. The base layer 2702 may contain a primer. The ceramic coating layer 2703 may be formed of a composition containing a ceramic material (e.g., a ceramic compound), and the ceramic material may include at least one of SiO2, Al2O3, and ZrO2. The ceramic coating layer 2703 may be formed on one surface of the base layer 2702 through a sputtering process, or may be formed by coating one surface of the base layer 2702 with a coating solution containing a ceramic material. The adhesive layer 2701 may be formed to be non-conductive and may be formed of a material not affecting radio waves radiated by a communication module. For example, the adhesive layer 2701 may be formed of a sticker, an adhesive, or a double-sided tape.

In various embodiments, the ceramic layer 270 may be formed of a double-sided ceramic layer 270 that includes a base layer 2702, ceramic coating layers 2703 formed on opposite surfaces of the base layer 2702, and an adhesive layer 2701 formed on one of the ceramic coating layers 2703.

Figure 7:
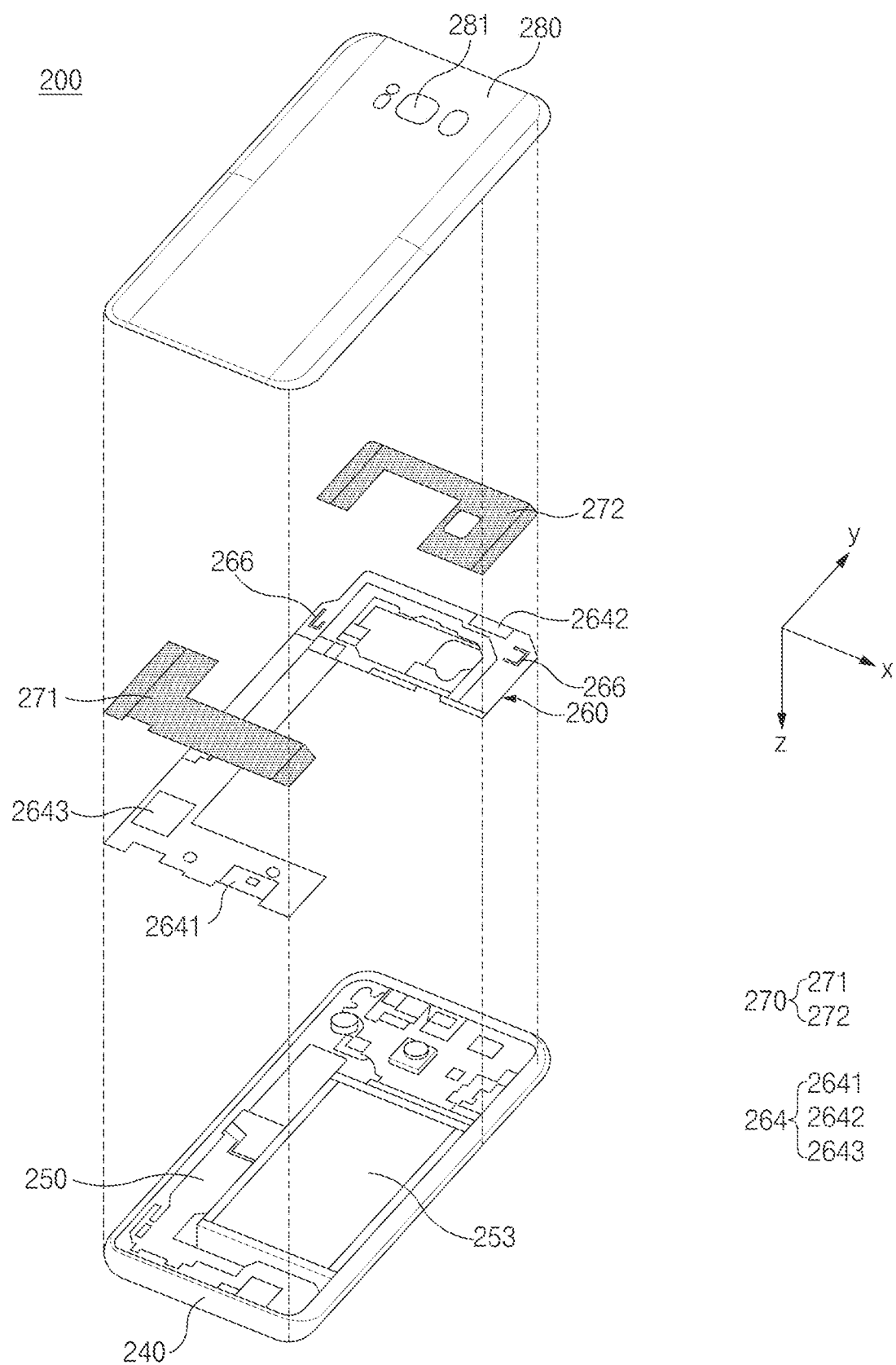
FIG. 7 is an exploded perspective view of the electronic device according to an embodiment.

FIG. 7 is an exploded perspective view of the electronic device according to an embodiment.

Referring to FIG. 7, the electronic device 200 may include the side member 240 (e.g., the side bezel structure 140 of FIG. 3) in which the circuit board 250 (e.g., the printed circuit board 150 of FIG. 3) and the battery 253 (e.g., the battery 190 of FIG. 3) are disposed, the second cover 280 (e.g., the back plate 180 of FIG. 3) that is coupled to the side member 240, the rear case 260 disposed between the second cover 280 and the circuit board 250, and first communication modules 264 and second communication modules 266 that are included in the rear case 260 (e.g., the second support member 160 of FIG. 3). The first communication modules 264 may be separate modules disposed on the rear case 260, or may be implemented with conductive patterns formed on the rear case 260. In the illustrated embodiment, the circuit board 250 may include the one or more electrical elements 251. The rear case 260 may be formed in a shape substantially corresponding to the circuit board 250. Ceramic films 271 and 272 may be disposed between the rear case 260 and the second cover 280.

In an embodiment, the rear case 260 may include first communication modules 2641, 2642, and 2643 for a wireless communication function of the electronic device 200.

Referring to FIG. 7, the first communication modules 2641, 2642, and 2643 may be disposed on a lower end portion (e.g., an end portion facing in the −Y-axis direction), an upper end portion (e.g., an end portion facing in the +Y-axis direction), and a lateral portion (e.g., an end portion facing in the −X-axis direction) of the rear case 260. In various embodiments, the first communication modules 2641, 2642, and 2643 may be disposed or formed on the periphery of the rear case 260. For example, the first communication modules 264 may be modules that perform a communication function of at least one of LTE and an mmWave antenna module (e.g., a 5G antenna module).

In an embodiment, the electronic device 200 may further include the second communication modules 266 included in the rear case 260. The second communication modules 266 may be separate modules disposed on the rear case 260, or may be implemented with conductive patterns formed on the rear case 260. For example, the second communication modules 266 may include at least one of a GPS module, a Wi-Fi module, and a Bluetooth module.

In the illustrated embodiment, the ceramic films 271 and 272 may include the first ceramic film 271 that covers the first communication modules 2641 and 2643 disposed on the lower end portion of the rear case 260 and the second ceramic film 272 that covers the first communication module 2642 disposed on the upper end portion of the rear case 260 and the second communication modules 266. In this case, each of the first ceramic film 271 and the second ceramic film 272 may be attached to a partial area of the rear case 260, or may be attached to an inner surface of a partial area of the second cover 280.

In various embodiments, the number or shapes of ceramic films 271 and 272 may vary depending on the number and mounting positions of first communication modules 264 or second communication modules 266 for which the permittivity is desired to be adjusted and are not necessarily limited to those illustrated in the drawing. Furthermore, each of the first ceramic film 271 and the second ceramic film 272 may have a different physical property (e.g., permittivity, thickness, or double-sided coating or not) depending on wireless communication performance required for the first communication modules 264 or the second communication modules 266 that correspond thereto.

Figure 8:
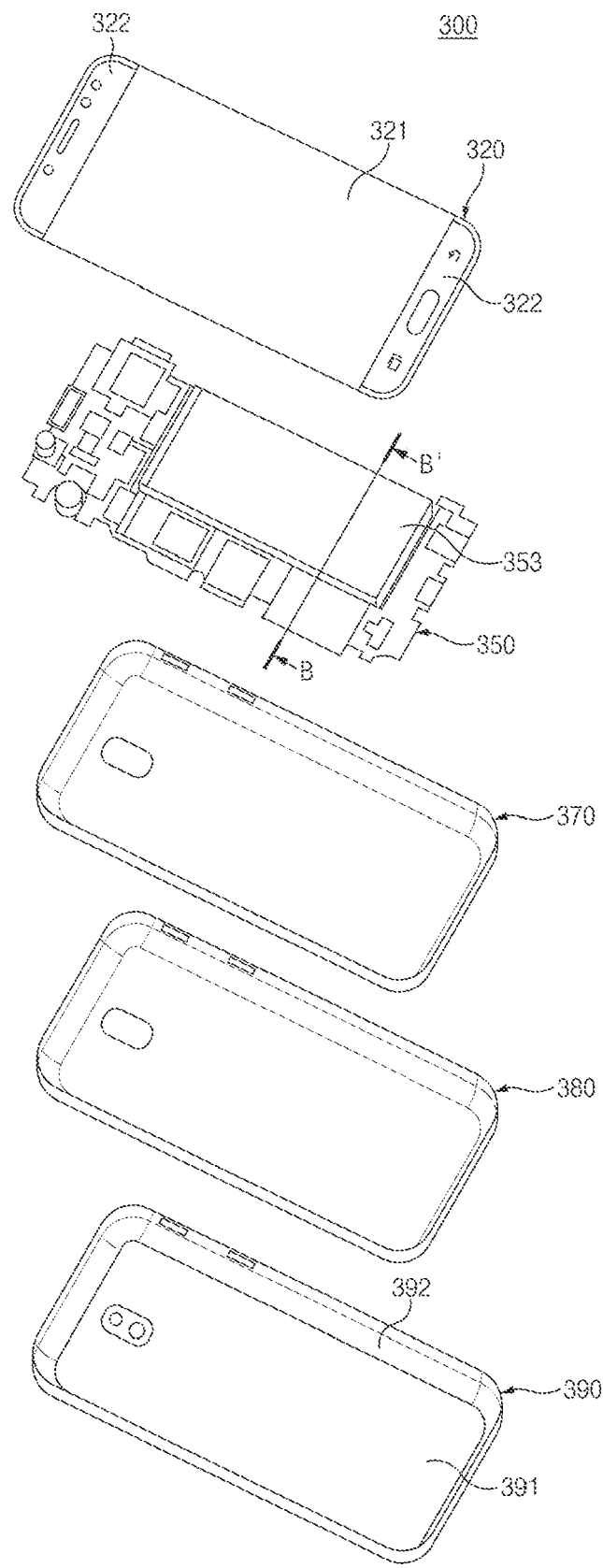
FIG. 8 is an exploded perspective view of an electronic device according to another embodiment.

FIG. 8 is an exploded perspective view of an electronic device according to another embodiment.

Referring to FIG. 8, the electronic device 300 may include a front cover 320 having a display area 321 formed therein through which a display is visually exposed, a circuit board 350 disposed under the front cover 320, a housing 390 (e.g., the side member 140 and the second cover 180 of FIG. 3, or the first structure 242 of the side member 240 and the second cover 280 of FIG. 4) that is coupled with the front cover 320 to form an interior space, and a ceramic film 370 formed on an inner surface of the housing 390. Here, the housing 390 may be formed of a composition containing a ceramic material.

Referring to FIG. 8, the housing 390 may include a first portion 391 (e.g., the second cover 280 of FIG. 4) that forms a rear surface of the electronic device 300 and a second portion 392 (e.g., the first structure 242 of the side member 240 of FIG. 4) that forms side surfaces of the electronic device 300. The display area 321 of the front cover 320 may be formed of a transparent glass material, and a bezel area 322 surrounding the periphery of the display area 321 may be formed to be opaque. The display (not illustrated) may be visually exposed through the display area 321.

In an embodiment, the ceramic film 370 may be formed in a shape corresponding to the housing 390 and may be disposed to cover an inner surface of the first portion 391 and an inner surface of the second portion 392. Alternatively, the ceramic film 370 may be attached to the inner surfaces of the first portion 391 and the second portion 392. The illustrated embodiment may be the electronic device 300 in which radio waves radiated by a communication module (e.g., the first communication modules 264 of FIG. 7 or the second communication modules 266 of FIG. 7) pass through the first portion 391 and the second portion 392 of the housing 390. That is, it may mean a case where radio waves are radiated through the side surfaces of the electronic device 300.

In an embodiment, radio-wave characteristics of radio waves passing through side surfaces of the housing 390 may be adjusted by a partial area of the ceramic film 370 disposed on the inner surface of the second portion 392 of the housing 390, and radio-wave characteristics of radio waves passing through a rear surface of the housing 390 may be adjusted by a partial area of the ceramic film 370 disposed on the inner surface of the first portion 391 of the housing 390.

In various embodiments, the electronic device 300 may further include an anti-scattering film 380 formed on the inner surface of the housing 390. In various embodiments, the housing 390 containing the ceramic material may be relatively vulnerable to an external impact, and a problem that ceramic fragments are scattered by the external impact may occur. In this case, the anti-scattering film 380 may prevent the ceramic fragments from being scattered when the housing 390 is damaged. Accordingly, the anti-scattering film 380 may preferably be formed on, or attached to, the first portion 391 and the second portion 392 of the housing 390.

In various embodiments, likewise to the ceramic film 370, the anti-scattering film 380 may contain a ceramic material and may have a predetermined permittivity. The anti-scattering film 380 may be integrally formed with, or separate from, the ceramic film 370. For example, in a case where the anti-scattering film 380 and the ceramic film 370 are formed to be separate from each other, the anti-scattering film 380 may be directly attached to the inner surface of the housing 390, and the ceramic film 370 may be additionally attached to the anti-scattering film 380. Furthermore, because the anti-scattering film 380 affects characteristics of radio waves radiated from the communication module (e.g., the first communication modules 266 of FIG. 7 or the second communication modules 266 of FIG. 7), a physical property (e.g., permittivity) of the anti-scattering film 380 may be determined in consideration of effects of the anti-scattering film 380, the housing 390, and the ceramic film 370 on radiation of radio waves.

In various embodiments, the anti-scattering film 380 or the ceramic film 370 may be pressed against the inner surface of the housing 390 in a process of manufacturing the housing 390, or may be previously formed in a shape corresponding to the inside of the housing 390 and attached to the inner surface of the housing 390. The anti-scattering film 380 or the ceramic film 370 may be attached to the inner surface of the housing 390 through vacuum pressing, vacuum lamination, or an autoclave process.

Figure 9:
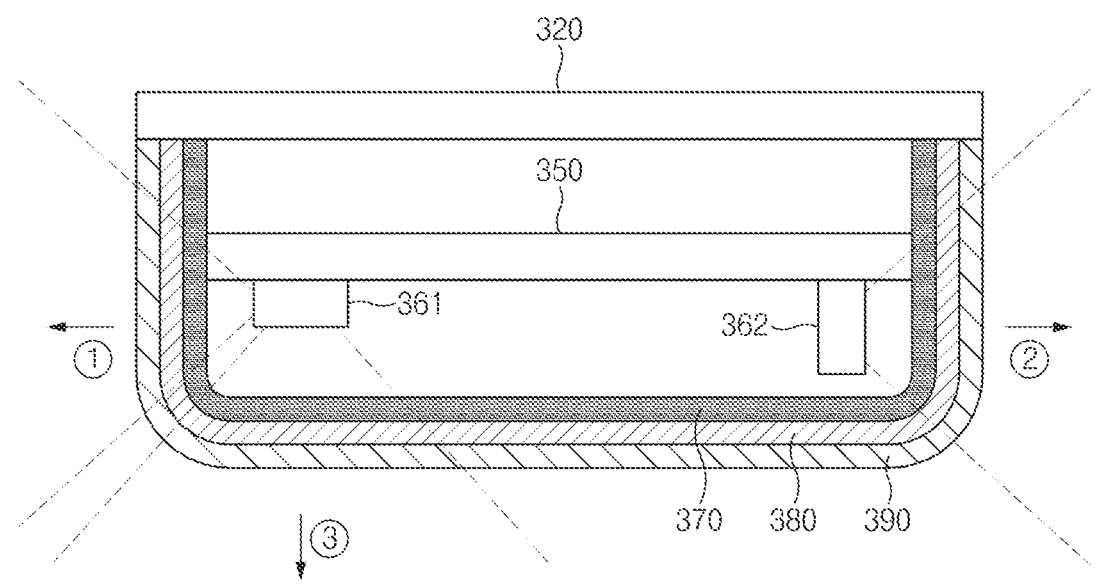
FIG. 9 is a sectional view of the electronic device according to the other embodiment.

FIG. 9 is a sectional view of the electronic device according to the other embodiment. FIG. 9 is a sectional view of the electronic device taken along line B-B' of FIG. 8

Referring to FIG. 9, third communication modules 361 and 362 may be disposed on a surface of the circuit board 350 that faces toward the rear surface of the electronic device 300. The third communication modules 361 and 362 may include communication module 3-1 361 from which radio waves are radiated in a first direction (direction ① in the drawing, a direction to pass through a left side surface of the housing 390) and communication module 3-2 362 from which radio waves are radiated in a second direction (direction ② in the drawing, a direction to pass through a right side surface of the housing 390). In this case, regions of the side surfaces of the housing 390 through which radio waves radiated by the third communication modules 361 and 362 pass may contain a ceramic material or a non-conductive material.

In another embodiment, at least one (e.g., communication module 3-1 361) of the third communication modules 361 and 362 may radiate radio waves in a direction to pass through the rear surface of the electronic device 300.

In another embodiment, one or more ceramic films 370 and 380 may be disposed on the inner surface of the housing 390 (e.g., the inner surfaces of the first portion 391 and the second portion 392 of FIG. 8). Alternatively, a ceramic layer may be formed on the inner surface of the housing 390. Accordingly, radio waves radiated from communication module 3-1 361 and communication module 3-2 362 may pass through the one or more ceramic films 370 and 380, and characteristics of the radio waves may be changed by a structure having a new permittivity formed by the ceramic films 370 and 380. For example, when the permittivity of the housing 390 itself corresponds to a first permittivity, the housing 390 and the ceramic films 370 and 380 may form a second permittivity together.

In another embodiment, the electronic device 300 may include the housing 390 containing various ceramic compositions, and an additional material may be further contained in the ceramic compositions depending on the color of the housing 390. In a case where the additional material is a conductive material, characteristics of radio waves radiated from the communication modules 361 and 362 may be changed, and in a case of including the same communication module, the electronic device 300 may have different wireless communication performances depending on colors of the electronic device 300. To solve such problems, the electronic device 300 according to the other embodiment may include the ceramic film 370, thereby uniformly maintaining characteristics of radio waves radiated to the outside of the housing 390.

Figure 10:
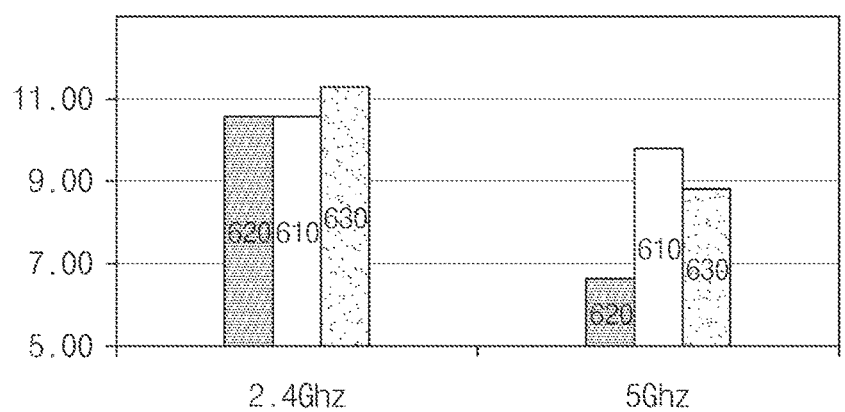
FIG. 10 illustrates test data regarding wireless communication performances of the electronic devices illustrated in FIGS. 4 to 9.
Figure 10:
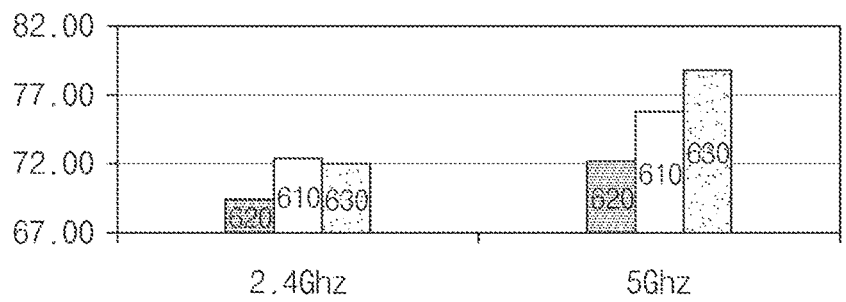

FIG. 10 illustrates test data regarding wireless communication performances of the electronic devices illustrated in FIGS. 4 to 9. In this test, a wireless communication performance difference depending on a difference in color between housings was evaluated, and a reduction of the difference by a ceramic film was tested.

An electronic device 630 of an experimental example in the test data illustrated in FIG. 10 is according to the embodiments illustrated in FIGS. 4 to 9 and may include a housing (e.g., the first cover 220, the second cover 280, and the side member 240 of FIG. 7, or the front cover 320 and the housing 390 of FIG. 8) that contains a ceramic material, a communication module (e.g., the first communication modules 264 and the second communication modules 266 of FIG. 7), and a ceramic film (e.g., the ceramic layer 270 of FIG. 7, the ceramic film 370 of FIG. 8, and the anti-scattering film 380 of FIG. 8).

An electronic device 610 of a comparative example includes a white housing and a communication module, but does not include a ceramic film. An electronic device 620 of a comparative example includes a black housing and a communication module, but does not include a ceramic film.

Referring to the test data of FIG. 10, it can be seen that there is a difference in wireless communication performance depending on the colors of the housings even though the same communication module is included. Specifically, a difference in transmission performance between the electronic device 610 including the white housing and the electronic device 620 including the black housing may be 0.02 dB in the 2.4 GHz band and 3.14 dB in the 5 GHz band. Furthermore, a difference in reception performance therebetween may be 2.95 dB in the 2.4 GHz band and 3.62 dB in the 5 GHz band. This is because as described above, the housings containing ceramic materials further contain separate compounds for representing various colors and the compounds affect the wireless communication performances of the communication modules.

Meanwhile, it can be seen that a wireless communication performance difference decreases when a ceramic film is further included even though a housing having a different color is included. Specifically, it can be seen that a difference in wireless communication performance between the electronic device 630 including the black housing and a single-sided film and the electronic device 610 including the white housing is smaller than that when there is no single-sided film.

A difference in transmission performance may be 0.71 dB in the 2.4 GHz band and 1.00 dB in the 5 GHz band. Furthermore, a difference in reception performance may be 0.46 dB in the 2.4 GHz band and 2.99 dB in the 5 GHz band. Although the transmission performance difference in the 2.4 GHz band increases from 0.02 dB to 0.71 dB, the absolute value is small, and therefore it cannot be regarded as a significant difference. Consequently, it can be seen that the wireless communication performance difference of the electronic device is decreased despite the change in the color of the housing. This is because as described above, characteristics of radio waves radiated from the communication module are adjusted by the ceramic film disposed between the communication module and the housing. However, the physical property of the ceramic film or the color of the housing included in the electronic device 630 according to the embodiment is not limited to the test data illustrated in FIG. 10, and the electronic device 630 may include various ceramic films and housings having various colors. For example, the ceramic film may be implemented with a single-sided or double-sided ceramic film, may have various thicknesses, and may contain various materials.

According to an embodiment of the disclosure, an electronic device including a housing containing ceramic and a compound may further include an appropriate ceramic film depending on the compound contained in the housing, thereby achieving uniform wireless communication performance. Accordingly, the electronic device according to the embodiment may have uniform wireless communication performance irrespective of the color of the housing, the type of the compound contained in the housing, or the type of communication module.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program) including one or more instructions that are stored in a storage medium (e.g., an internal memory or an external memory) that is readable by a machine (e.g., an electronic device (the electronic device 200 of FIG. 4 or the electronic device 300 of FIG. 5)). For example, a processor of the machine (e.g., the electronic device 200 of FIG. 4 or the electronic device 300 of FIG. 5) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
  a housing including a first portion having a first permittivity;
  a circuit board disposed in the housing, the circuit board having a communication module disposed on a surface of the circuit board configured to face the first portion;
  a ceramic layer having a predetermined permittivity and formed between the circuit board and an inner surface of the first portion,
  and being configured to pass radio waves radiated from the communication module; and
  an anti-scattering film comprising a ceramic material having a predetermined permittivity and attached to the inner surface of the first portion of the housing between the inner surface of the first portion of the housing and the ceramic layer,
  wherein the radio waves are configured to pass sequentially through at least a portion of the first portion, at least a portion of the anti-scattering film, and at least a portion of the ceramic layer, and
  wherein the first portion, the anti-scattering film, and the ceramic layer located on radiation paths of the radio waves together form a dielectric portion having a second permittivity different from the first permittivity and the second permittivity.

2. The electronic device of claim 1,
wherein the housing includes a first surface configured to face in a first direction, a second surface configured to face in a second direction opposite to the first direction, and a third surface configured to surround a space between the first surface and the second surface,
wherein the electronic device further comprises a display disposed between the first surface and the circuit board and configured to face in the first direction, and
wherein the first portion includes at least part of the second surface.

3. The electronic device of claim 1, further comprising:
a display disposed between a first surface of the housing and the circuit board,
wherein the display is visually exposed through the first surface of the housing.

4. The electronic device of claim 1, wherein the ceramic layer is formed on an inner surface of the first portion of the housing by coating.

5. The electronic device of claim 1, wherein the ceramic layer includes a ceramic film including a coating surface coated with a ceramic material.

6. The electronic device of claim 5,
wherein the communication module includes a first communication module and a second communication module,
wherein the ceramic film includes a first film disposed between the first communication module and the housing and a second film disposed between the second communication module and the housing, and
wherein the first film has a different permittivity from the second film.

7. The electronic device of claim 5,
wherein the ceramic film further includes an adhesive surface opposite to the coating surface, and
wherein the adhesive surface is attached to the first portion of the housing.

8. The electronic device of claim 1,
wherein the circuit board includes a main circuit board having one or more electrical elements disposed thereon and an antenna board having the communication module disposed thereon, and
wherein the antenna board is formed on at least part of a periphery of an inner surface of the housing.

9. The electronic device of claim 1, wherein at least part of the housing is formed of a composition containing a ceramic material and a metal compound.

10. An electronic device comprising:
a first cover having a display area formed therein;
a second cover configured to face the first cover and formed of a composition containing a first ceramic material having a first permittivity;
a side frame configured to surround a space between the first cover and the second cover;
a circuit board disposed in the space formed by the first cover, the second cover, and the side frame, the circuit board including a communication module configured to transmit and receive radio waves,
a radiation area through which the radio waves pass is formed in at least part of the second cover;
a ceramic film disposed between the radiation area of the second cover and the communication module to pass the radio waves, the ceramic film containing a second ceramic material; and
an anti-scattering film comprising a third ceramic material and attached to an inner surface of the second cover between the inner surface of the second cover and the ceramic film;
wherein the radio waves are configured to pass sequentially through the radiation area, the anti-scattering film, and the ceramic film, and
wherein the radiation area of the second cover, the anti-scattering film, and the ceramic film together form a dielectric portion having a second permittivity different from the first permittivity.

11. The electronic device of claim 10, wherein the composition of which the second cover is formed further contains a metal compound.

12. The electronic device of claim 10, wherein each of the first ceramic material and the second ceramic material includes at least one of $SiO_2$, $Al_2O_3$, and $ZrO_2$.

13. An electronic device comprising:
a cover configured to form a first surface of the electronic device, the cover having a display area formed in at least part thereof;
a housing including a first portion configured to face the cover and a second portion configured to surround an interior space between the first portion and the cover, the housing being formed of a composition containing a ceramic material;
a communication module disposed in the interior space of the housing,
the communication module including a radiating surface configured to face at least part of the second portion of the housing;
a ceramic layer formed by coating an inner surface of the second portion of the housing disposed between the second portion of the housing and the radiating surface; and
an anti-scattering film comprising a ceramic material having a predetermined permittivity and attached to the inner surface of the second portion of the housing between the inner surface of the second portion of the housing and the ceramic layer,
wherein the communication module has a radiation path configured to sequentially pass through the ceramic layer, the anti-scattering film, and at least part of the second portion.

14. The electronic device of claim 13, wherein the radiating surface of the communication module includes an antenna board disposed to face the second portion, the antenna board having a conductive pattern formed thereon.

* * * * *